(12) United States Patent
Hsieh et al.

(10) Patent No.: US 9,956,742 B2
(45) Date of Patent: May 1, 2018

(54) DOPO DERIVATIVE AND COMPOSITE OF EPOXY APPLIED IN HIGH-FREQUENCY SUBSTRATE

(71) Applicant: Jiangsu Yoke Technology Co., Ltd, Jiangsu Province (CN)

(72) Inventors: Tung-Ying Hsieh, Jiangsu Province (CN); Qi Shen, Jiangsu Province (CN); Jung-Che Lu, Jiangsu Province (CN)

(73) Assignee: Jiangsu Yoke Technology Co., Ltd, Jiangsu Province (CN)

( * ) Notice: Subject to any disclaimer, the term of this patent is extended or adjusted under 35 U.S.C. 154(b) by 0 days. days.

(21) Appl. No.: 14/927,493

(22) Filed: Oct. 30, 2015

(65) Prior Publication Data

US 2016/0129666 A1 May 12, 2016

(30) Foreign Application Priority Data

Nov. 10, 2014 (CN) .......................... 2014 1 0629878

(51) Int. Cl.
| | | |
|---|---|---|
| C08K 3/36 | (2006.01) | |
| H05K 1/02 | (2006.01) | |
| H05K 1/03 | (2006.01) | |
| B32B 5/02 | (2006.01) | |
| B32B 15/14 | (2006.01) | |
| B32B 5/26 | (2006.01) | |
| B32B 15/20 | (2006.01) | |
| B32B 5/22 | (2006.01) | |

(52) U.S. Cl.
CPC ............... *B32B 5/022* (2013.01); *B32B 5/02* (2013.01); *B32B 5/024* (2013.01); *B32B 5/22* (2013.01); *B32B 5/26* (2013.01); *B32B 15/14* (2013.01); *B32B 15/20* (2013.01); *C08K 3/36* (2013.01); *H05K 1/0373* (2013.01); *B32B 2260/021* (2013.01); *B32B 2260/023* (2013.01); *B32B 2260/046* (2013.01); *B32B 2262/06* (2013.01); *B32B 2262/08* (2013.01); *B32B 2262/10* (2013.01); *B32B 2262/101* (2013.01); *B32B 2264/102* (2013.01); *B32B 2307/20* (2013.01); *B32B 2307/204* (2013.01); *B32B 2307/306* (2013.01); *B32B 2307/3065* (2013.01); *B32B 2307/50* (2013.01); *B32B 2307/546* (2013.01); *B32B 2307/558* (2013.01); *B32B 2307/714* (2013.01); *B32B 2307/7242* (2013.01); *B32B 2307/7265* (2013.01); *B32B 2307/734* (2013.01); *B32B 2457/00* (2013.01); *B32B 2457/08* (2013.01); *B32B 2553/00* (2013.01); *H05K 2201/012* (2013.01)

(58) Field of Classification Search
CPC .......... H05K 1/0373; H05K 2201/012; H05K 2260/023; H05K 2457/08; H05K 5/022; H05K 2307/3065; C08K 3/36; C08L 63/00; C08L 83/06; B32B 2264/102; B32B 2307/3065

USPC ............... 442/141, 378, 233, 234; 428/297.4
See application file for complete search history.

(56) References Cited

U.S. PATENT DOCUMENTS

2012/0055705 A1 * 3/2012 White ............... C07F 9/657172
174/259

FOREIGN PATENT DOCUMENTS

| | | |
|---|---|---|
| CN | 102428091 A | 4/2012 |
| CN | 102504532 A | 6/2012 |
| CN | 103408594 A | 11/2013 |
| CN | 103408595 | * 11/2013 |
| CN | 103408595 A | 11/2013 |
| JP | 11-106619 | 4/1999 |
| JP | 2001-172555 A | 6/2001 |
| JP | 2001-270993 A | 10/2001 |
| JP | 2002-020461 A | 1/2002 |
| JP | 2004-197032 A | 7/2004 |
| JP | 2004-528285 A | 9/2004 |
| JP | 2007-031461 A | 2/2007 |
| JP | 2012-527469 A | 11/2012 |
| JP | 2012-527520 A | 11/2012 |
| JP | 2013-525276 A | 6/2013 |
| TW | 201136944 A | 11/2011 |
| WO | 2008010429 A1 | 1/2008 |
| WO | 2012064703 A1 | 5/2012 |

* cited by examiner

*Primary Examiner* — Camie S Thompson
(74) *Attorney, Agent, or Firm* — CKC & Partners Co., Ltd.

(57) ABSTRACT

A composite, a high-frequency circuit substrate using the same and method thereof are discussed. The composite includes the following solid components: a DOPO (9,10-dihydro-9-oxa-10-phosphaphenanthrene 10-oxide) derivative compound of 10-70 wt %, a curing agent of 10-50 wt %, one or more epoxy of 10-90 wt % and an inorganic filling material of 10-40 wt %. The non-halogen low dielectric epoxy composite uses a high-purity DOPO (9,10-dihydro-9-oxa-10-phosphaphenanthrene 10-oxide) derivative as tiny particles dispersing in the composite. The crosslinking yield of the composite is not reduced, while the heat resistance and flame retardancy are increased. The prepreg and copper foil covered laminate for use in printed circuit board, made from the epoxy composite, has great dielectric property and high glass transition temperature (GTT), satisfying the need of high frequency in electronic signal transmission and high speed in data processing of the industry of copper covered printed circuit board.

10 Claims, No Drawings

DOPO DERIVATIVE AND COMPOSITE OF EPOXY APPLIED IN HIGH-FREQUENCY SUBSTRATE

RELATED APPLICATIONS

This application claims priority to China Application Serial Number 201410629878.1, filed Nov. 10, 2014, which is herein incorporated by reference.

BACKGROUND

Field of Invention

The present invention relates to a flame retardant in the field of chemical materials, wherein a DOPO derivative compound is reacted with a epoxy group of a epoxy resin under the presence of a curing agent so as to obtain a cured non-halogen flame-retardant epoxy composite being friendly to the environment and characterized of low dielectric property and excellent heat resistance.

Description of Related Art

As defined by the chemical structure of itself, the epoxy resin has great performances in terms of reactivity, toughness, flexibility and the like, and also has good mechanical and electrical performances as well as dimensional stability; the adhesion of the epoxy resin to different substrates is also great. The cured epoxy resin can not only keep the original properties of the substrates, but also have improved barrier properties to water, gas and chemicals, as well as having advantages of light weight and low cost. Therefore the epoxy can be widely applied in electronics and aerospace industries, especially in the fields of semiconductor packaging materials and substrates of printed circuit boards. On the other hand, with the rapid changes in science and technology, many computer information industries, communication industries and consumer electronics also vary quickly. Throughout the whole electronics industry, its development features are as follows:

1. the using frequency becomes higher; and
2. the manufacturing technical level becomes higher.

For example, the printed circuit board are developed in the tendency of low-dielectric, low thermal expansion, multilayer, high heat resistance and the like. Meanwhile, for satisfying the requirement of being friendly to the environment, the electronics and communication products are also developed in the tendency of being lightweight, thin, short and small, having high reliability, multiple functions and being environment friendly. With high frequency of the use of wireless networks and communication devices, the high-frequency substrate will become the future development trend. The requirements for materials used in the high-frequency substrate are no more than being capable of transferring data quickly, without causing data loss or data interference during the transfer process. Therefore the material selected for manufacturing the high-frequency communication device should have the following basic characteristics:

(1) low and stable dielectric constant;
(2) small dielectric consumption factor;
(3) low water absorption;
(4) excellent chemical resistance;
(5) great heat resistance; and
(6) being non-halogen and flame-retardant.

Relatively, an organic phosphorus flame retardant is generally recognized as an important specie for replacing the halogen flame retardant, since the organic phosphorus flame retardant has low smoke amount, is not liable to form a poisonous gas and a corrosive gas, and is environment friendly. In the field of epoxy resin and board' material, the application of reactive-type organic phosphorus flame retardant, such as a DOPO derivative, is common, where such a flame retardant is linked onto the epoxy resin through covalent bonding, which has smaller influence to the material property. The application of an additive-type organic phosphorus flame retardant in the epoxy resin field is relative less, since the epoxy resin field has high requirements for the melting point and suability of flame retardant, which are difficult to reach for general flame retardants.

There are few patent reports for DOPO derivatives linked through ether bonding as an additive-type flame retardant (see, Japanese Patent Laid-Open No. Heisei 11[1999]-106619 and Japanese Patent Laid-Open No. P2001-270993A). However, studies on synthesis methods of the additive-type flame retardant are less and such a preparation method has low yield and high cost. There is no report of applying it as a flame retardant of an epoxy composite on a high-frequency substrate.

SUMMARY in view of the disadvantages of the prior art, the present invention provides a simple and high-efficiency method for preparing a DOPO derivative, so as to enable the derivative to be purified easily with high yield and low cost. The derivative is then combined with an epoxy composite to produce an electronic material with low dielectric constant, high heat resistance and great flame retardancy which can be applied in a printed circuit board.

The preparation of a DOPO derivative is characterized in that: a compound (A) is prepared through a dehydration reaction between a compound (B) and a compound (C) for 4-30 hours under the presence of a catalyst, an entrainer and a solvent, at an atmosphere and at a temperature of 150-220° C.

The molecular formula of compound (A) is:

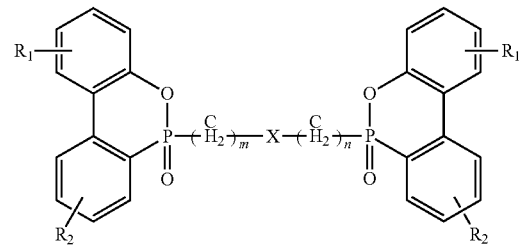

wherein, R1, R2 are H, alkyl, aryl or a heterocyclic substituent group (sites on the substituent group that does not react with an aliphatic hydroxyl group) X is an oxygen atom or without substitute group, and m and n are respectively 1-8;

The molecular formula of compound (B) is:

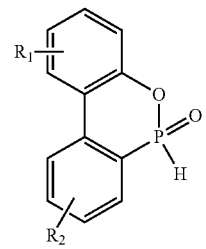

wherein R1 and R2 are defined as above;
The molecular formula of compound (C) is:

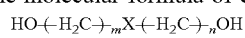

wherein m, n and X are defined as above.

The reaction formula is:

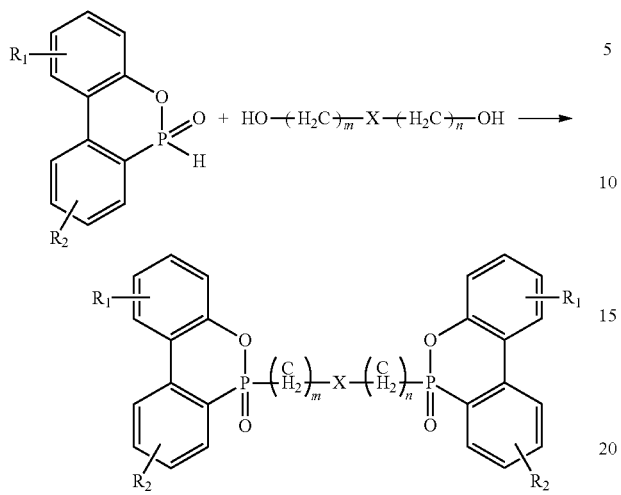

The molar ratio of the compound (C) to the compound (B) is preferably from 0.4 to 3.0. If the molar ratio is too low, it is difficult to improve the conversion ratio of the compound (B); and if the molar ratio is too high, then the amount of monosubstituted products is increased, and an issue of recovering the compound (C) occurs.

In the reaction formula, the catalyst is a catalyst suitable for a dehydration reaction or an Arbuzov reaction, including alkyl halides, alkali halides, alkali earth metal halides, transitional metal halides or a acid catalyst. Specifically, the catalyst includes a combination of one or more of the followings: sodium iodide, sodium bromide, potassium iodide, potassium bromide, lithium chloride, lithium bromide, lithium iodide, C1-C6 alkyl iodide, C1-C6 alkyl bromide, ferric chloride, ferric bromide, ferrous chloride, ferrous bromide, magnesium chloride, nickel chloride, nickel bromide, aluminium chloride, titanium chloride, stannic chloride, zinc chloride, copper powder, copper chloride, cobalt chloride, strontium bromide, sulfuric acid, chlorhydric acid, chloric acid, perchloric acid, phosphoric acid, hydrobromic acid, hydrofluoric acid, nitric acid, oxalic acid, alkyl sulfonic add and sultanate copolymers. The amount of the catalyst is 0.1-7.0% of the molar quantity of the compound (B).

The solvent required for the reaction is a high boiling solvent, i.e. a solvent with a boiling point over 150° C.; and a melting point over −100° C. at an ambient pressure. The solvent specifically includes diphenyl methane, diphenyl ethane, diphenyl propane, biphenyl, diphenyl ether, phenylcyclohexane, glycol dimethyl ether, glycol diethyl ether, or a mixture thereof.

The entrainer required for the reaction is a low boiling solvent, i.e. a solvent with a boiling point below 150'C at an ambient pressure, and the entrainer specifically includes benzene, methylbenzene, dimethylbenzene, dichioroethane, trichlormethane, tetrachloromethane, pentane, hexane, heptanes, octane, cyclohexane, or a mixture thereof.

The synthesis of compound (A) is performed by reacting between two active sites, i.e., the P—H bond of the compound (B) and the —OH of the compound (C), while the substituent groups R1 and R2 of the compound (B) does not participate in the reaction, as well as the oxyalkyl chain of the compound (C), so that variation of R1, R2, m and n has no significant effect on the reaction condition.

In another embodiment, the resulting DOPO derivative may be a compound (A-1) with the following structure formula:

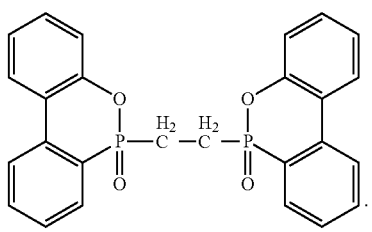 [SMILES: O=P1(CCP2(=O)Oc3ccccc3-c3ccccc32)Oc2ccccc2-c2ccccc21]

In a further embodiment, the resulting DOPO derivative may be a compound (A-2) with the following structure formula:

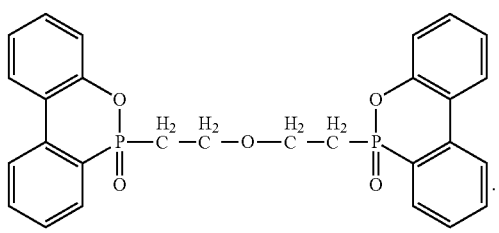 [SMILES: O=P1(CCOCCP2(=O)Oc3ccccc3-c3ccccc32)Oc2ccccc2-c2ccccc21]

In yet another embodiment, the resulting DOPO derivative may be a compound (A-3) with the following structure formula:

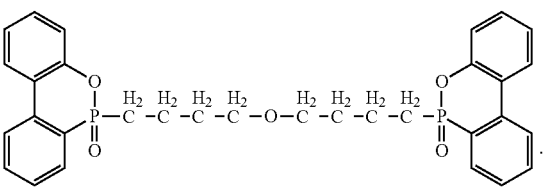 [SMILES: O=P1(CCCCOCCCCP2(=O)Oc3ccccc3-c3ccccc32)Oc2ccccc2-c2ccccc21]

In the epoxy composite of the present invention, the curing agent includes one or more of a phenolic curing agent, an amine curing agent, an acid or anhydride curing agent, a ester curing agent, and a phosphorous curing agent.

In the epoxy composite of the present invention, the epoxy resin includes at least one of the following compounds:

(1) a bifunctional epoxy resin, which includes a bisphenol-A epoxy resin, a bisphenol-F epoxy resin, a biphenyl-type epoxy resin, a naphthalene-ring-type epoxy resin, a dicyclopentadiene-type epoxy resin and a cyanate-ester-type epoxy resin;

(2) a novolac epoxy resin, which includes a phenolic novolac epoxy resin, a bisphenol-A novolac resin and a o-cresol formaldehyde epoxy resin;

(3) a phosphorous-containing epoxy resin, which includes a (9,10-dihydro-9-oxa-10-phospha-phenanthrene-10-oxide) (DOPO) modified epoxy resin, and 10-(2,5-dihydroxy-naphthyl)-DOPO;

(4) a naphthalene-ring-type epoxy resin; and
(5) a biphenyl-type epoxy resin.

The aforementioned epoxy resins can be used separately or in combination depending on application. If the biphenyl-type epoxy resin, the naphthalene-ring-type epoxy resin or the o-cresol formaldehyde epoxy resin is used, then the cured resin has a relative high glass transition temperature and a better heat resistance.

In the epoxy composite of the instant disclosure, the inorganic filling material includes one or more of aluminium hydroxide, zeolite, wollastonite, silicon dioxide, magnesium oxide, calcium silicate, calcium carbonate, clay, talc and mica.

The phosphorus content of the aforementioned epoxy composite is controlled at 1-5%, and a prepreg is prepared from the composite. The prepreg includes a substrate and the epoxy composite, and the epoxy composite is laminated onto the substrate after soaking and drying, and a fabric or nonwoven fabric is used as the substrate, such as a natural fiber, an organic fiber and an inorganic fiber. The method for preparing the composite of the instant disclosure is a conventional method. Solid contents are first added, and then a solvent including one or more of acetone, butanone, cyclohexanone, ethylene glycol monomethyl ether, propylene glycol monomethyl ether, propylene glycol methyl ether acetate and the like is added, stirring conducted until the solid contents are dissolved completely, then a liquid resin is added, and then the stirring is continued until an equilibrium is reached. The aforementioned composite is added into a container. An accelerating agent, a curing agent are first dissolved in certain butanone solvent, and the solid content of the solution is appropriately adjusted to 65%-75% by using the butanone solvent, so as to form a glue solution. Then a fabric such as a glass fiber or an organic material is impregnated with the glue solution; and then the impregnated glass fiber cloth is baked in an oven at 170° C. for 3-5 minutes to obtain the prepreg.

A copper foil covered laminate made of the aforementioned composite includes multiple laminated prepregs, each including a substrate and the epoxy composite laminated onto the substrate after soaking and drying.

A copper foil covered laminate for use in the printed circuit board of the present invention, is formed by first gluing two or more prepregs together through heating and pressuring so as to form a laminated plate, and then covering a copper foil on one or both sides of the laminated plate. The copper foil covered laminate should satisfy the following requirements: 1. the temperature rising rate for laminating, where the temperature rising rate at the material temperature of 80-170° C. should be controlled at 1-3° C./min; 2. the pressure setting for laminating, where a full pressure of about 250 psi is applied when the material temperature of the outer layer is 80-100° C.; and 3. during curing, the material temperature is controlled at 180° C. for 120 min. In addition to the copper foil, the covered metal foil may be an aluminum foil and the like, without any limitation on the material.

The following embodiments further illustrate and describe in details the measuring of the dielectric dissipation factor, heat resistance, water absorption, glass transition temperature, flame retardancy and the like properties of the implemented copper foil covered laminate (8 laminates are glued together) for use in the printed circuit board.

DETAILED DESCRIPTION

In order to make the description of the present invention more detailed and more comprehensive, various aspects and embodiments of the present invention are described below illustratively. However, these illustrated aspects and embodiments are not the only way for implementing or using the embodiments of the invention. The embodiments disclosed hereinafter may be combined with or replaced by each other under beneficial situations, and alternatively other embodiments may be appended to an embodiment, without any further statement or illustration. In the following description, many specific details are illustrated so that readers can understand the following embodiments completely. However, the embodiments of the present invention may also be implemented without these specific details.

The embodiment is described in details as follows, but the instant disclosure is not limited to the scope of the embodiment.

The components used in the examples and comparative examples are listed as follows:
Polybutadiene Epoxy:
(A) polybutadiene epoxy
Benzoxazine:
(B) allyl-functional benzoxazine
Epoxy Resin:
(C-1) o-cresol formaldehyde epoxy resin
(C-2) dicyclopentadiene epoxy resin
Curing Agent:
(D-1) styrene-maleic anhydride oligomer SMA-FE40
(D-2) phosphorous curing agent AHP-60H
Additive-Type Flame Retardant:
(E-1) aryloxyphosphazene SPB-100
(E-2) compound (A-1)
(E-3) compound (A-2)
(E-4) compound (A-3)
Curing Accelerator:
(F) 2-methyl-4-ethylimidazole
Inorganic Filling Material:
(G) spherical silica powder
Formula of the Glue Composite:

TABLE 1

|     | Example 1 | Example 2 | Example 3 | Example 4 | Example 5 | Example 6 | Comparative Example 1 | Comparative Example 2 |
|-----|-----------|-----------|-----------|-----------|-----------|-----------|-----------------------|-----------------------|
| A   | 15        | 26        | 35        | 25        | 20        | 50        |                       | 45                    |
| B   | 42        | 34        | 25        | 25        | 30        | 22        | 35                    |                       |
| C-1 |           |           |           |           | 10        |           | 30                    |                       |
| C-2 | 12        |           | 10        | 24        |           |           |                       |                       |
| D-1 | 18        |           |           |           |           | 15        |                       |                       |
| D-2 |           | 25        | 22        | 16        | 23        |           | 25                    | 40                    |
| E-1 | 5         |           |           |           |           | 5         |                       | 6                     |
| E-2 | 8         |           | 8         |           |           | 8         |                       | 9                     |
| E-3 |           | 15        |           |           |           |           |                       |                       |

TABLE 1-continued

|   | Example 1 | Example 2 | Example 3 | Example 4 | Example 5 | Example 6 | Comparative Example 1 | Comparative Example 2 |
|---|---|---|---|---|---|---|---|---|
| E-4 | | | | | | | | |
| E-5 | | | | 10 | 17 | | 10 | |
| F | appropriate | appropriate | appropriate | appropriate | appropriate | appropriate | appropriate | appropriate |
| G | 30 | 30 | 30 | 30 | 30 | 30 | 30 | 30 |

TABLE 2

|   | Example 7 | Example 8 | Example 9 | Example 10 | Example 11 | Example 12 | Comparative Example 3 | Comparative Example 4 |
|---|---|---|---|---|---|---|---|---|
| A | 25 | 20 | 30 | 22 | 25 | 30 | 15 | 30 |
| B | 25 | 30 | 22 | 28 | 25 | 25 | 60 | 35 |
| C-1 | | 10 | | 10 | | 15 | 10 | |
| C-2 | 10 | | 10 | | 15 | | | |
| D-1 | | | | | 20 | 15 | 15 | |
| D-2 | 18 | 20 | 20 | 25 | | | | 20 |
| E-1 | 10 | 10 | | | 9 | 9 | | |
| E-2 | | | | | | | | |
| E-3 | 12 | | 18 | | 6 | | | |
| E-4 | | 10 | | 15 | | 6 | | |
| E-5 | | | | | | | | 15 |
| F | appropriate | appropriate | appropriate | appropriate | appropriate | appropriate | appropriate | appropriate |
| G | 30 | 30 | 30 | 30 | 30 | 30 | 30 | 30 |

Evaluation Table of Physical Properties:

TABLE 3

|   | Example 1 | Example 2 | Example 3 | Example 4 | Example 5 | Example 6 | Comparative Example 1 | Comparative Example 2 |
|---|---|---|---|---|---|---|---|---|
| Glass Transition Temperature | 175 | 172 | 165 | 165 | 173 | 150 | 161 | 155 |
| Peel Strength | 8.72 | 8.75 | 8.71 | 8.72 | 8.8 | 7.3 | 8.71 | 8.75 |
| Flame Retardancy | V-0 | V-0 | V-0 | V-0 | V-0 | V-1 | V-0 | V-0 |
| Thermal Stability | >60 | >60 | >60 | >60 | >60 | >45 | >60 | >60 |
| Water Absorption | 0.12 | 0.22 | 0.18 | 0.13 | 0.11 | 0.35 | 0.15 | 0.35 |
| PCT 2 HR 288° C. | 5 MIN | 5 MIN | 5 MIN | 5 MIN | 5 MIN | 5 MIN | 3 MIN | 5 MIN |
| Dk | 3.5 | 3.8 | 3.6 | 3.7 | 3.6 | 3.4 | 4.1 | 4.0 |
| Df | 0.002 | 0.005 | 0.003 | 0.005 | 0.006 | 0.002 | 0.012 | 0.01 |

TABLE 4

|   | Example 7 | Example 8 | Example 9 | Example 10 | Example 11 | Example 12 | Comparative Example 3 | Comparative Example 4 |
|---|---|---|---|---|---|---|---|---|
| Glass Transition Temperature | 168 | 171 | 169 | 170 | 168 | 171 | 189 | 175 |
| Peel Strength | 8.71 | 8.68 | 8.75 | 8.8 | 8.77 | 8.8 | 8.61 | 8.76 |
| Flame Retardancy | V-0 | V-0 | V-0 | V-0 | V-0 | V-0 | V-1 | V-0 |
| Thermal Stability | >60 | >60 | >60 | >60 | >60 | >60 | >60 | >60 |
| Water Absorption | 0.15 | 0.18 | 0.16 | 0.15 | 0.18 | 0.17 | 0.14 | 0.25 |

TABLE 4-continued

| | Example 7 | Example 8 | Example 9 | Example 10 | Example 11 | Example 12 | Comparative Example 3 | Comparative Example 4 |
|---|---|---|---|---|---|---|---|---|
| PCT 2 HR 288° C. | 5 MIN | 5 MIN | 5 MIN | 5 MIN | 5 MIN | 5 MIN | 2 MIN | 3 MIN |
| Dk | 3.7 | 3.8 | 3.5 | 3.7 | 3.8 | 3.72 | 4.0 | 4.4 |
| Df | 0.008 | 0.009 | 0.005 | 0.009 | 0.008 | 0.009 | 0.015 | 0.016 |

The measuring methods of the aforementioned physical properties are as follows:

(1) glass transition temperature:
The temperature rising rate=20° C./min, as measured by a differential scanning calorimeter (DSC).

(2) peel strength:
The test piece is cut into a rectangle and put into a testing device, so as to test the peel strength of the metal covering layer with a certain speed and pulling force (3) flame retardancy:
The test piece is cut into a rectangle of 0.5 in×4.7 in, then fired for 10 seconds with a blue flame having a flame height of 2 cm, and then the flame is removed, where the test piece is fired twice to record the automatic quench time after the flame is removed.

(4) thermal stability:
The test piece is cut and grounded flush, and then put into a thermogravimetric analyzer (TMA) for testing.

(5) water absorption:
The test piece is heated in a pressure cooker of 2 atm at 120° C. for 30 min.

(6) electrical properties:
The etched substrate is cut into a square test piece of 5 cm$^2$, baked for 2 h in an oven at 105° C., taken out and then is tested by a plate thickness tester to obtain the plate thicknesses at three positions thereon. Then the test piece is clamped in a dielectric tester to test the data of three positions and then obtain a mean value.

(7) T288 board angle damafe:
The test piece is heated in a pressure cooker of 2 atm at 120° C. for 120 min, soaked in a solder bath at 288° C. for 20 seconds, and then observed to find whether delaminating occurs.

In view of the results of the aforementioned test, properties of low-dielectric, great flame retardancy, low water absorption can be achieved according to the present invention. The present invention also sufficiently uses the synergistic effect among the polybutadiene epoxy, benzoxazine, epoxy resin and curing agent, and satisfies the requirement of environment protection by applying a non-halogen board material. The aforementioned descriptions are only preferred embodiments of the present invention, and other corresponding variations falling into the scope of claims of the present invention can be made according to the technical solutions and ideas of the present invention by those of ordinary skills in the art.

What is claimed is:
1. An epoxy composite, wherein based on the weight of solid contents, the composite comprises:
a DOPO derivative compound of 6-15 wt %;
a curing agent of 20-25 wt %;
one or more epoxy resin of 10-15 wt %; and
an inorganic filling material of 10-40 wt %.
2. The epoxy composite of claim 1, wherein the DOPO derivative compound has the following structure:

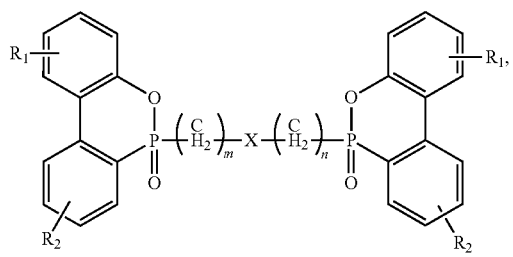

wherein R1, R2 are H. alkyl, aryl or a heterocyclic substituent group (sites on the substituent group that does not react with an aliphatic hydroxyl group); X is an oxygen atom, and m and n are respectively 4;
wherein the DOPO derivative compound is prepared through a dehydration reaction between a compound (B) and a compound (C) under the presence of a catalyst, an entrainer and a solvent, at 1-6 atmosphere and at a temperature of 150-220° C.;
wherein the compound has the following structure:

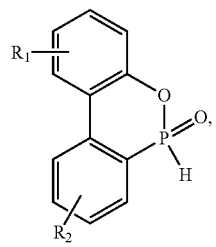

wherein R1 and R2 are defined as above;
wherein the compound (C) has the following structure:

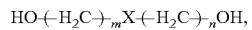

wherein m, n and X are defined as above, and the catalyst is a catalyst suitable for the dehydration reaction or Arbuzov reaction.
3. The epoxy composite of claim 1, wherein the DOPO derivative compound has the following structure:

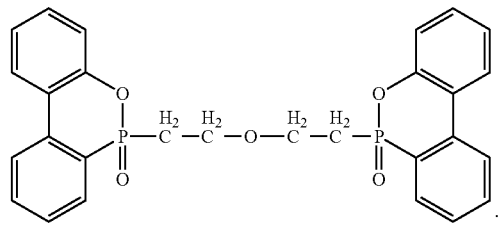 [SMILES: O=P1(CCOCCP2(=O)Oc3ccccc3-c3ccccc32)Oc2ccccc2-c2ccccc21]

4. The epoxy composite of claim 1, wherein the DOPO derivative compound has the following structure:

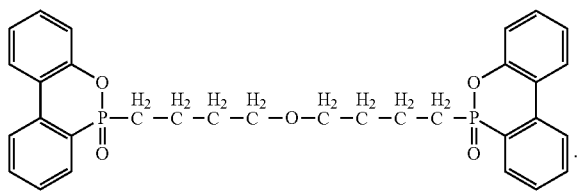 [SMILES: O=P1(CCCCOCCCCP2(=O)Oc3ccccc3-c3ccccc32)Oc2ccccc2-c2ccccc21]

5. The epoxy composite of claim 1, wherein the curing agent is one or more of a phenolic curing agent, an amine curing agent, an acid or anhydride curing agent, a ester curing agent, and a phosphorous-containing curing agent.

6. The epoxy composite of claim 1, wherein the epoxy resin comprises at least one of the following compounds:
 a bifunctional epoxy resin, a novolac epoxy resin, a phosphorous-containing epoxy resin, a naphthalene-ring-containing epoxy resin, and a biphenyl-containing epoxy resin.

7. The epoxy composite of claim 1, wherein the inorganic filling material is one or more of aluminium hydroxide, zeolite, wollastonite, silicon dioxide, magnesium oxide, calcium silicate, calcium carbonate, clay, talc and mica.

8. A prepreg made of the epoxy composite of claim 1, comprising a substrate and the epoxy composite laminated onto the substrate after soaking and drying.

9. The prepreg of claim 8, wherein the substrate is a fabric or nonwoven fabric.

10. A copper foil covered laminate made of the prepreg of claim 8, comprising a plurality of laminated prepregs and a copper foil covered on one or both sides of the laminated prepregs, wherein each prepreg comprises a substrate and the epoxy composite laminated onto the substrate after soaking and drying.

* * * * *